US006461940B1

(12) United States Patent
Hasegawa et al.

(10) Patent No.: US 6,461,940 B1
(45) Date of Patent: Oct. 8, 2002

(54) DICING BLADE AND METHOD OF PRODUCING AN ELECTRONIC COMPONENT

(75) Inventors: Yoshiki Hasegawa; Yasunobu Yoneda, both of Takefu (JP)

(73) Assignee: Murata Manufacturing Co., Ltd. (JP)

(*) Notice: Subject to any disclaimer, the term of this patent is extended or adjusted under 35 U.S.C. 154(b) by 20 days.

(21) Appl. No.: 09/593,470

(22) Filed: Jun. 14, 2000

(30) Foreign Application Priority Data

Jun. 21, 1999 (JP) .......................................... 11-173773

(51) Int. Cl.[7] ................................................ H01L 31/00

(52) U.S. Cl. ........................ 438/460; 83/676; 76/101.1; 125/13.01; 125/15; 125/22

(58) Field of Search ........................... 438/460; 83/676; 76/101.1; 125/13.01, 15, 22

(56) References Cited

U.S. PATENT DOCUMENTS 4,779,811 A * 10/1988 Takasaki ..................... 241/293
5,085,110 A * 2/1992 Scholtysik ................... 83/676
5,303,688 A * 4/1994 Chiuminatta ................. 125/15
5,309,962 A * 5/1994 McCord, Jr. ................ 144/237
5,479,911 A * 1/1996 Lewinson et al. ............ 125/15

FOREIGN PATENT DOCUMENTS

JP 6-188308 7/1994
JP 6-268059 9/1994

* cited by examiner

*Primary Examiner*—Hoai Ho
*Assistant Examiner*—Thao P. Le
(74) *Attorney, Agent, or Firm*—Ostrolenk, Faber, Gerb & Soffen, LLP

(57) ABSTRACT

A dicing blade is disclosed which is capable of precisely cutting an object at a high speed without causing significant deposition of swarf upon a cut surface even when the object being cut has a large thickness. The dicing blade includes a ring-shaped cutting blade having a cutting edge formed on the peripheral rim of the ring-shaped cutting blade. At least one slit with a depth greater than the thickness of an object to be cut is formed in the cutting edge.

11 Claims, 4 Drawing Sheets

FIG. 4
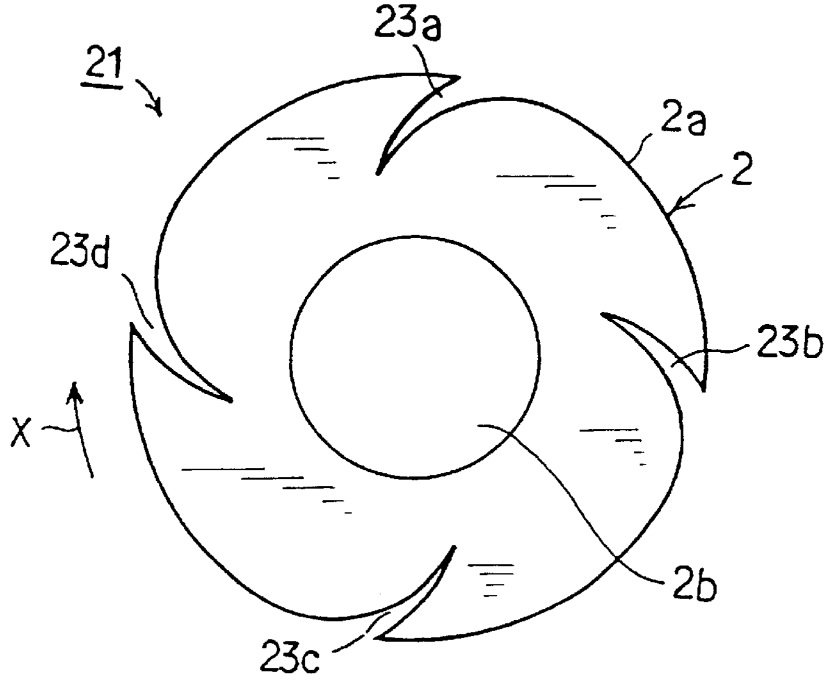
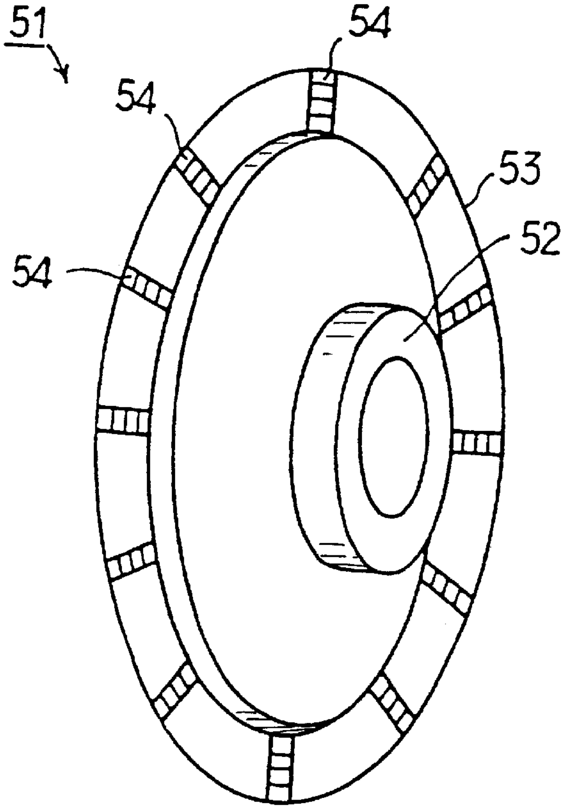
FIG. 6
PRIOR ART

DICING BLADE AND METHOD OF PRODUCING AN ELECTRONIC COMPONENT

BACKGROUND OF THE INVENTION

1. Field of the Invention

The present invention relates to a dicing blade for use in cutting an object such as a non-baked ceramic material and to a method of producing an electronic component using the dicing blade.

2. Description of the Related Art

In production of an electronic ceramic component, a multilayer ceramic mother object is prepared and cut in its thickness direction into individual pieces of multilayer objects to be formed into electronic ceramic components. Thereafter, the individual pieces of multilayer objects are baked into a sintered form. Finally, an outer electrode is formed on the outer surface of each sintered object.

A force-cutting blade is most often used to cut a raw ceramic material such as a multilayer ceramic mother object. On the other hand, in the production of semiconductor chips, a dicing blade is widely used to cut a wafer into chips.

An example of a dicing blade is disclosed in Japanese Unexamined Patent Publication No. 6-188308. FIG. 6 illustrates the structure of a dicing blade 51 disclosed in the patent cited above, wherein the dicing blade 51 includes a ring-shaped cutting blade 53 attached to a holder 52. A cutting edge is formed on the peripheral rim of the cutting blade 53. A plurality of grooves 54, extending in radial directions, are formed on opposite surfaces of the cutting edge 53 such that the grooves 54 result in a partial reduction in the thickness of the cutting edge 53.

The grooves 54 formed on the cutting edge allow a sufficient amount of cooling water and purified washing water to be supplied to a cutting edge thereby cooling the cutting edge 53 and removing swarf therefrom.

When using the above-described dicing blade, a relative large amount of swarf is generated when an object being cut has a large thickness. When the object is cut at a high speed, swarf is not removed smoothly enough through the grooves 54.

As a result, a large load is imposed upon the dicing blade and the surface of the object being cut becomes rough. Furthermore, a large wobble is induced in the dicing blade which reduces cutting accuracy.

When a non-baked multilayer mother object is cut by a dicing blade into individual pieces which will be further formed into electronic multilayer ceramic components, the non-baked multilayer mother object includes a binder contained in a ceramic material and also includes a conductive paste used to form inner electrodes. As a result, swarf generated during a cutting process includes conductive paste particles and binder particles which can cause swarf to stick to a cutting surface of the object being cut. The resultant sticky swarf cannot be easily removed. When the object being cut has a large thickness, the above problem is serious.

It is an object of the present invention to provide a dicing blade capable of cutting an object while smoothly removing swarf even when the object has a large thickness, and thus making the dicing blade capable of precisely cutting the object without causing the surface of the object being cut to be significantly contaminated. It is another object of the present invention to provide a method of producing an electronic component using such as dicing blade.

SUMMARY OF THE INVENTION

According to an aspect of the present invention, there is provided a dicing blade comprising a ring-shaped cutting blade having a cutting edge formed on the peripheral rim thereof, said ring-shaped cutting blade having at least one slit formed in a thickness direction of the dicing blade on the peripheral rim and extending to the cutting edge, the depth of the at least one slit, as measured in the radial direction of the dicing blade, being greater than the thickness of an object to be cut.

Preferably, the slit is formed such that the width of the slit decreases from the cutting edge toward the center of the dicing blade.

Furthermore, the slit is preferably formed in an arcuate shape when viewed in a direction perpendicular to a plane in which the cutting edge of the ring-shaped cutting blade lies.

According to the method of the present invention, electronic components are formed by:

- providing a non-baked multilayer object having a plurality of inner electrodes formed therein;
- cutting the non-baked multilayer object along its thickness direction into a plurality of individual pieces of multilayer objects using a ring-shaped cutting blade having a cutting edge formed on a peripheral rim thereof, the ring-shaped cutting blade having at least one slit formed in a thickness direction of the blade on the peripheral rim of the cutting blade and extending to the cutting edge, the depth of the at least one slit, as measured in a radial direction of the ring-shaped cutting blade, being greater than the thickness of the multilayer object.

The width of the slit preferably decreases from the cutting edge toward the center of the dicing blade and the slits are preferably formed in an arcuate shape as viewed in a direction perpendicular to the plane in which the cutting edge lies.

A plurality of slits, preferably four, are formed in the peripheral rim.

The inner electrodes are formed of a conductive paste and ceramic electrodes are located between respective pairs of the inner electrodes.

After the non-baked multilayer object has been cut into small pieces using the cutting blade, the individual pieces of multilayer objects are baked to form sintered objects. Finally, one or more outer electrodes are formed on the sintered objects.

BRIEF DESCRIPTION OF THE DRAWINGS

Other features and advantages of the present invention will become apparent from the following description of the invention which refers to the accompanying drawings.

FIG. 4 is a front view of a third embodiment of a dicing blade according to the present invention;

FIG. 6 is a perspective view of an example of a conventional dicing blade.

DETAILED DESCRIPTION OF EMBODIMENTS OF THE INVENTION

The present invention is described in further detail below with reference to specific embodiments in conjunction with the accompanying drawings.

Figure 1A:
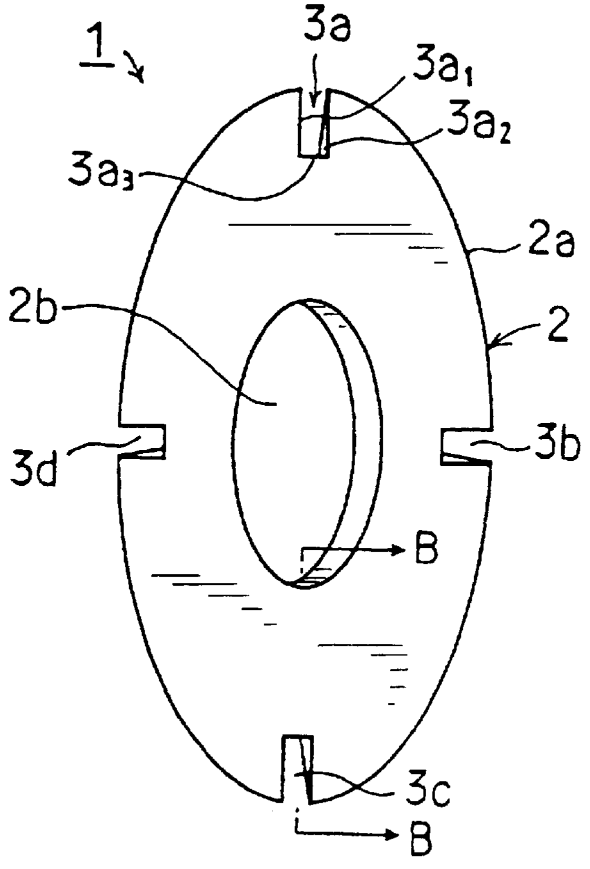
FIG. 1A is a perspective view of a first embodiment of a dicing blade according to the present invention.
Figure 1B:
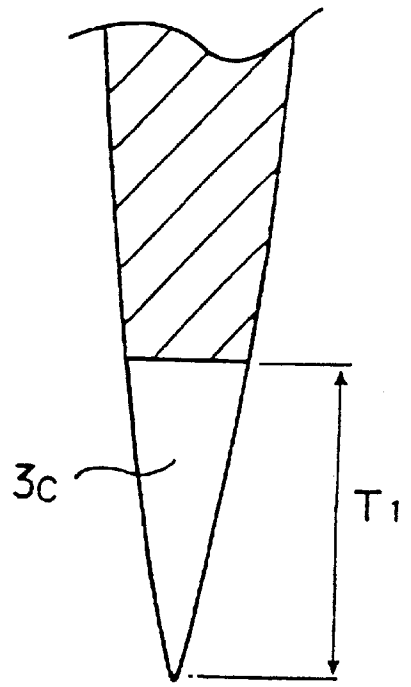
FIG. 1B is a cross-sectional view, partially cutaway, of the dicing blade taken along line B—B of FIG. 1A.

FIG. 1A is a perspective view of a first embodiment of a dicing blade constructed according to the principles of the present invention, and FIG. 1B is a cross-sectional view, partially cutaway, of the dicing blade taken along line B—B of FIG. 1A.

The dicing blade 1 of the present embodiment has a ring-shaped cutting blade 2 preferably made of diamond (in the form of particles) or a similar material. A cutting edge 2*a* is formed on the peripheral rim of the ring-shaped cutting blade 2.

The dicing blade 1 has an opening 2*b* formed in the center of the ring-shaped cutting blade 2. The ring-shaped cutting blade 2 is fitted with a holder (not shown) via the opening 2*b*.

Figure 2:
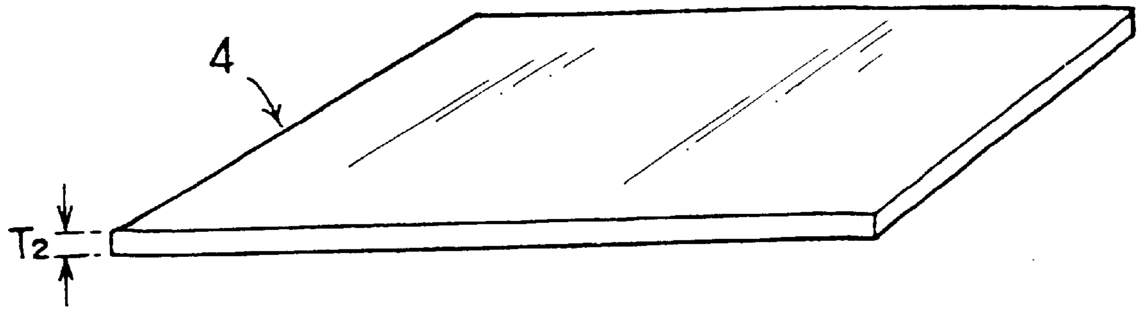
FIG. 2 is a perspective view illustrating a multilayer ceramic mother object as an example of an object to be cut.

The dicing blade 1 has a plurality of slits 3*a*–3*d* formed in the cutting edge 2*a*. The plurality of slits 3*a*–3*d* extend through the cutting edge 2*a* in a direction across the thickness of the cutting edge 2*a*. Each slit 3*a*–3*d* is open at the tip of the cutting edge 2*a*. A representative slit 3*c* is shown in FIG. 1B. The slit 3*c* has a depth T1, as measured in the radial direction of the blade 1, which is greater than the thickness of objects to be cut. FIG. 2 schematically illustrates a multilayer ceramic mother object 4 as an example of an object to be cut. When the thickness of the multilayer ceramic mother object 4 is given by T2, then T1>T2.

In the present embodiment, the width of each slit 3*a*–3*d* is constant over its entire depth from the tip of the cutting edge to the bottom of the slit. By way of example, a slit 3*a* has a pair of side walls 3*a*1 and 3*a*2 (FIG. 1A) which extend in parallel to each other, and the bottoms of side walls 3*a*1 and 3*a*2 are connected to each other via a bottom wall 3*a*3.

To cut an object using the dicing blade 1, the ring-shaped cutting blade 2 of the dicing blade 1 is rotated about its center axis. For example, a multilayer mother object 4 such as that shown in FIG. 2 is cut in its thickness direction by the rotating ring-shaped cutting blade 2. Because the slits 3*a*–3*d* are formed in the cutting blade 2, swarf generated during the cutting process is smoothly removed to the surface of the multilayer mother object 4 via the slits 3*a*–3*d*.

If the depth T1 of the slits 3*a*–3*d* is smaller than the thickness T2 of the multilayer mother object 4 being cut, the slits 3*a*–3*d* are buried in the multilayer mother object 4 being cut, and thus swarf is not smoothly removed.

A method of producing an electronic ceramic component using the dicing blade 1 of the present embodiment is described below.

First, a non-baked multilayer mother object 4 is prepared which consists of a plurality of inner electrodes which are formed of a conductive paste and which are laminated via respective ceramic layers. A specific method of preparing the non-baking multilayer mother object 4 is known in the art. Any suitable method for producing a multilayer capacitor may be employed.

The multilayer mother object 4 is then cut in its thickness direction while the dicing blade 1 is rotated about its axis thereby separating it into individual multilayer objects to be formed into electronic components. Because the dicing blade 1 has the slits 3*a*–3*d*, swarf is smoothly removed, and thus the dicing blade does not encounter a significant wobble. Thus, the multilayer mother object 4 can be cut precisely.

The individual pieces of multilayer objects to be formed into electronic components are then baked, thereby obtaining sintered objects. An outer electrode is then formed on the outer surface of each sintered object such that the outer electrode is electrically connected to the inner electrodes. Specific methods for the baking process and the outer electrode forming process are also known, for example, in the art of the electronic multilayer ceramic component.

In the production of electronic multilayer ceramic components, because the cutting process using the dicing blade can be performed with high-precision, the multilayer electronic components have a high dimensional accuracy. Furthermore, swarf is smoothly removed during the cutting process, and no significant sticking of swarf to the surface of the resultant multilayer components occurs. This technique of the invention is advantageous in that no significant sticking of a binder and a conductive paste occurs. Thus, the produced electronic multilayer ceramic components have high reliability.

Although in the embodiment described above with reference to FIG. 1, the slits 3*a*–3*d* formed in the dicing blade 1 each have the constant width over the entire depth from the tip of the cutting edge 2*a* to the bottom of the slits, the shape of the slits of the dicing blade 1 is not limited to this shape. In a second embodiment and a third embodiment described below with reference to FIGS. 3 and 4, respectively, slits are formed in different shapes.

Figure 3:
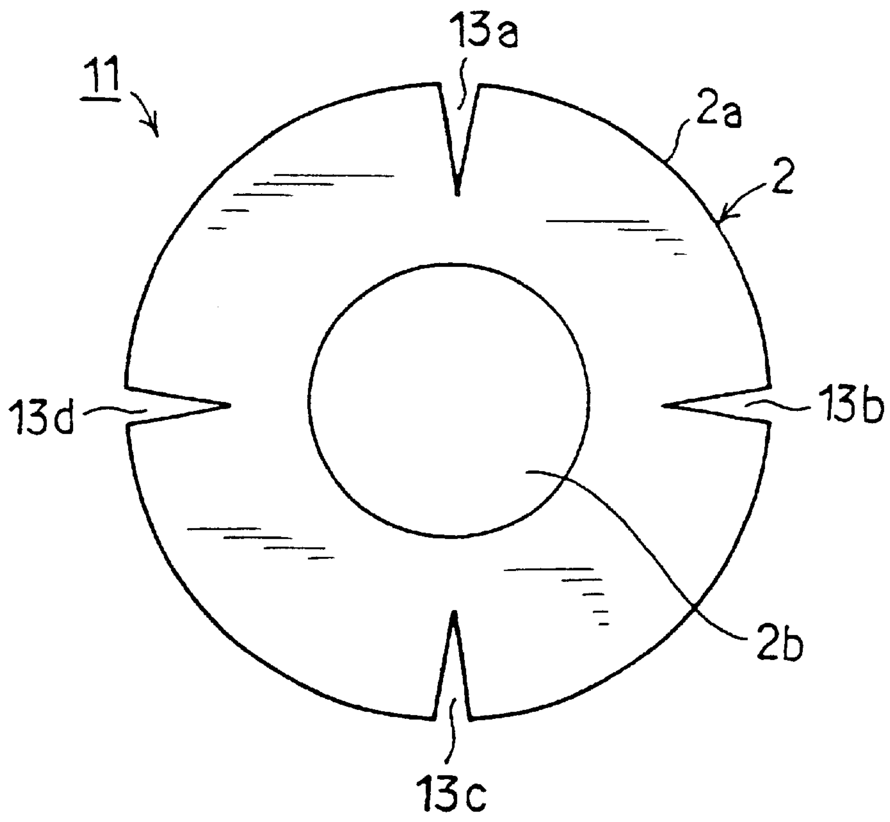
FIG. 3 is a front view of a second embodiment of a dicing blade according to the present invention.

As shown in FIG. 3, a dicing blade 11 according to the second embodiment has slits 13*a*–13*d* whose width decreases along a depth direction from the tip of the blade edge 2*a* to the bottom of the slits.

In a dicing blade 21 according to the third embodiment, as shown in FIG. 4, slits 23*a*–23*d* are formed in an arcuate shape. More specifically, when the dicing blade 21 is viewed in a direction perpendicular to a plane in which the cutting edge 2*a* lies, that is, when the dicing blade 21 is seen from the side shown in FIG. 4, the slits 23*a*–23*d* have an arcuate shape. If the dicing blade 21 is rotated in a direction denoted by an arrow X in FIG. 4, swarf is removed more smoothly via the slits 23*a*–23*d*.

The effectiveness of the present invention is described below with reference to specific experimental examples.

There was prepared a dicing blade with a cutting edge formed of diamond particles and having an outer diameter of72 mm, an inner diameter of 65 mm, wherein slits 3*a*–3*d* with a width W equal to 1.0 mm, a depth T1 equal to 3.0 mm, and a thickness of 0.20 mm at the bottom were formed according to the technique disclosed above in the first embodiment.

There was also prepared a dicing blade 11, as a second experimental sample, which were produced in a similar manner to the first experimental sample of the dicing blade except that slits 13*a*–13*d* have the same width at their opening end as that of the first experimental sample but decrease in width from their opening end toward their bottom.

Furthermore, there was prepared a dicing blade 21, as a third experimental sample, having the same size as that of the first experimental sample of the dicing blade but having an arcuate shape (FIG. 4). Here, the depth of slits 23*a*–23*d* is defined by the distance from the center of the opening end of each slit 23*a*–23*d* to the bottom of each slit 23*a*–23*d* as measured along the radial direction.

For the purpose of comparison, there was also prepared a dicing blade 51, having the structure shown in FIG. 6, according to the conventional technique. The dicing blade 51 was produced in such a manner as to have the same outer dimension using the same material as the first experimental sample of the dicing blade. However, no slits 3*a*–*3d* were formed in the dicing blade 51. Instead, grooves 54 with a width of 1.0 mm and a depth of 3.0 mm were formed on both surfaces of the dicing blade 51. The number of grooves 54 for each surface was set to 16.

Cutting tests were performed using the first to third experimental samples of dicing blades and the dicing blade according to the conventional technique. As objects to be cut, there were prepared non-baked multilayer mother objects 4 with a size of 200 mm×200 mm×2.5 mm, in each of which 300 conductive Ni-paste layers were laminated.

The cutting test for each dicing blade was performed by cutting objects into pieces each having a size of 3 mm ×3 mm×2.5 mm at various cutting speeds including 100 mm/sec, 200 mm/sec, 300 mm/sec, and 400 mm/sec.

The surfaces of the obtained individual pieces of multilayer ceramic objects corresponding to individual electronic components were observed to check whether swarf was deposited on the surfaces. The results are shown in Table 1.

TABLE 1

DEPOSITION OF SWARF UPON CUTTING SURFACES OF MULTILAYER OBJECTS

| | CUTTING SPEED (mm/SEC) | | | |
|---|---|---|---|---|
| | 100 | 200 | 300 | 400 |
| FIRST EMBODIMENT | NOT DETECTED | NOT DETECTED | NOT DETECTED | DETECTED |
| SECOND EMBODIMENT | NOT DETECTED | NOT DETECTED | NOT DETECTED | DETECTED |
| THIRD EMBODIMENT | NOT DETECTED | NOT DETECTED | NOT DETECTED | NOT DETECTED |
| CONVENTIONAL TECHNIQUE | NOT DETECTED | NOT DETECTED | DETECTED | DETECTED |

Furthermore, the amount of wobble of the dicing blade was measured for each cutting speed. The amount of wobble refers to the amplitude of the wobble of the rotating dicing blade in a direction perpendicular to a plane in which the cutting edge of the dicing blade lies. The result is shown in FIG. 5.

Figure 5:
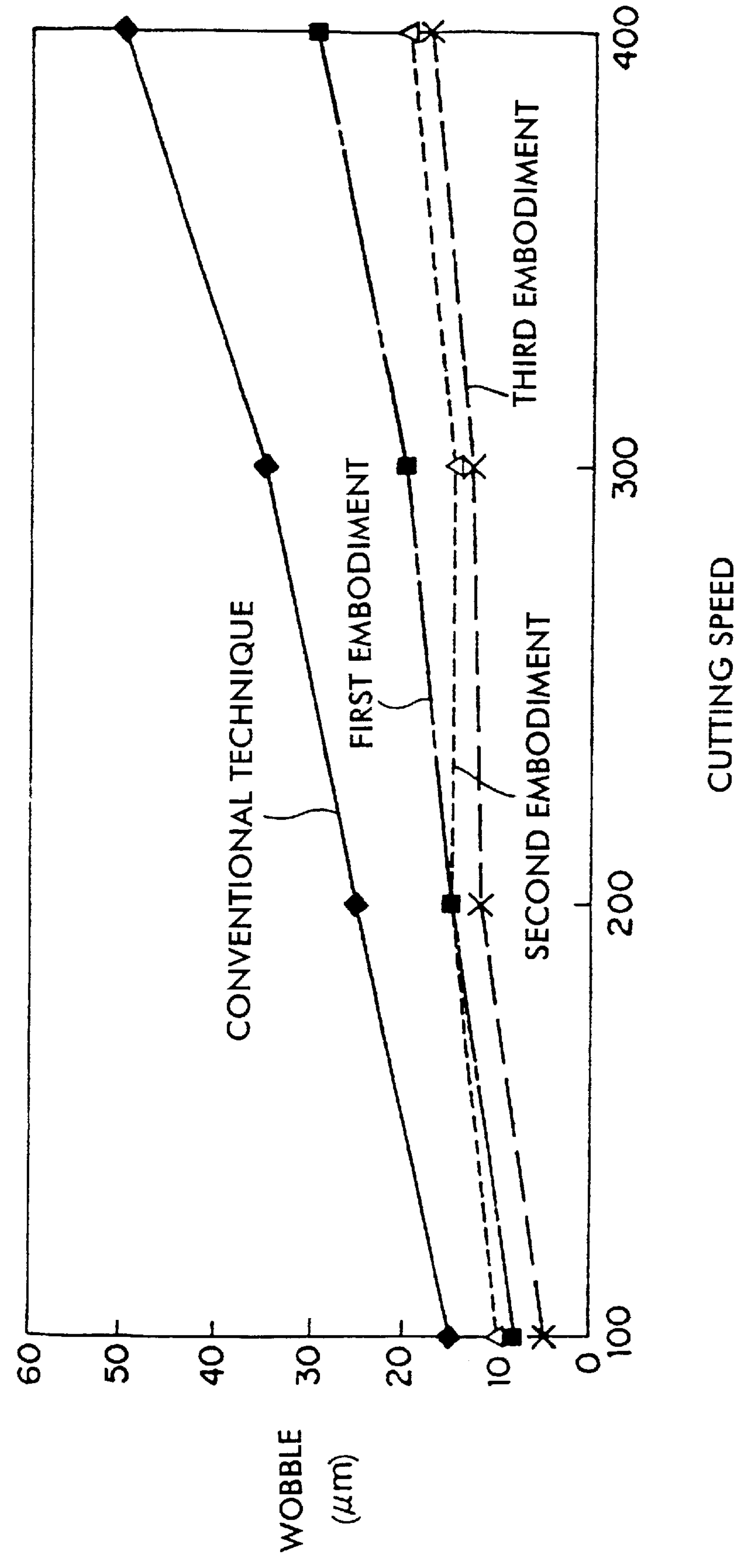
FIG. 5 is a graph illustrating the dependence of the wobble of a dicing blade upon the cutting speed for various dicing blades including those according to the first to third embodiments and a dicing blade according to a conventional technique.

As can be seen from Table 1 and FIG. 5, when the first experimental dicing blade was used, swarf was smoothly removed through the slits 3*a*–3*d*, and thus no swarf was observed on the surfaces of the obtained multilayer objects even when the cutting speed was increased up to 300 mm/sec. The amount of wobble of this dicing blade was small, as shown in FIG. 5.

In the case of the second experimental dicing blade, no swarf was observed on the surfaces of obtained pieces of multilayer objects for cutting speeds up to 300 mm/sec. The wobble of the dicing blade was smaller than that of the first experimental dicing blade.

When the third experimental dicing blade was used, swarf was removed in a further smooth fashion. As a result, no swarf was observed on the surfaces of obtained pieces of multilayer objects even when the cutting was performed at the highest speed, that is, 400 mm/sec. Furthermore, the wobble of the dicing blade was small even at the cutting speed of 400 mm/sec.

In contrast, when the conventional dicing blade 51 was used, swarf was not smoothly removed and observed on the surfaces of obtained multilayer objects when the cutting was performed at a speed of 300 mm/sec. Furthermore, the wobble of the dicing blade was greater than any of the first, second, and third experimental dicing blades at any cutting speed.

As can be understood from the above description, the present invention has great advantages. That is, the dicing blade according to the present invention has at least one slit formed in the cutting edge on the peripheral rim wherein the depth of the slit as measured in the radial direction of the dicing blade is set to be greater than the thickness of objects to be cut so that swarf is quickly removed from a cutting part to the outside during a cutting process in which an object is cut by the rotating dicing blade. Furthermore, the slit allows the wobble of the cutting edge of the dicing blade to be reduced to an extremely low level. As a result, it becomes possible to precisely cut an object at a high speed without causing swarf to be deposited on the cut surface of the object, even when the object being cut has a large thickness.

When the slit is formed such that its width decreases from the cutting edge toward the center of the dicing blade, swarf can be removed more smoothly and the wobble of the dicing blade becomes smaller, as described above with reference to the specific experimental examples. Thus, it becomes possible to cut an object more precisely.

In the case where the slit has an arcuate shape when seen in a direction perpendicular to a plane in which the cutting edge of the ring-shaped cutting blade lies, swarf can be removed in a still smoother fashion, and the wobble of the dicing blade during the cutting process is further reduced. Thus, it becomes possible to more precisely cut an object at a higher speed without causing swarf to be deposited on the cut surface of the object.

Furthermore, in the method of producing electronic components according to the present invention, a multilayer mother object can be cut in its thickness direction by the rotating dicing blade according to the invention into individual pieces of multilayer objects to be further formed into electronic components. In the cutting process, the dicing blade according to the present invention allows the multilayer mother object to be cut more precisely while effectively suppressing deposition of swarf upon the cut surfaces of the pieces of multilayer objects even if swarf containing a conductive paste is generated.

Thus, electronic multilayer ceramic components having high reliability can be produced by further baking the respective pieces of multilayer objects and then forming an outer electrode on the outer surface of each piece of sintered objects.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of producing electronic components, comprising:

providing a non-baked multilayer object having a plurality of inner electrodes formed therein;

cutting the non-baked multilayer object along its thickness direction into a plurality of individual pieces of multi-layer objects using a ring-shaped cutting blade having a cutting edge formed at a peripheral rim thereof, said ring-shaped cutting blade having at least one slit formed in the blade at said peripheral rim of said cutting blade including said cutting edge, a depth of said at least one slit, as measured in a radial direction of the ring shaped cutting blade, being greater than the thickness of said multilayer object.

2. A method according to claim 1, wherein a width of said slit decreases from said cutting edge toward a center of the dicing blade.

3. A method according to claim 1, wherein at least one of said at least one slit is formed in an arcuate shape as viewed in a direction perpendicular to a plane in which said cutting edge lies.

4. A method according to claim 1, wherein each of said at least one slit is formed in an arcuate shape as viewed in a direction perpendicular to a plane in which said cutting edge lies.

5. A method according to claim 1, wherein a plurality of said slits are formed in said peripheral rim.

6. A method according to claim 1, wherein four of said slits are formed in said peripheral rim.

7. A method according to claim 1, wherein said inner electrodes are formed of a conductive paste.

8. A method according to claim 7, wherein ceramic layers are located between respective pairs of said inner electrodes.

9. A method according to claim 8, further including baking the individual pieces of multilayer objects to form sintered objects.

10. A method according to claim 9, further including forming one or more outer electrodes on the sintered objects.

11. A method according to claim 10, wherein at least some of the outer electrodes are electrically connected to one or more of the internal electrodes.

* * * * *